(12) United States Patent
De Dea et al.

(10) Patent No.: US 9,632,418 B2
(45) Date of Patent: Apr. 25, 2017

(54) TARGET MATERIAL SUPPLY APPARATUS FOR AN EXTREME ULTRAVIOLET LIGHT SOURCE

(71) Applicant: ASML Netherlands B.V., Veldhoven (NL)

(72) Inventors: Silvia De Dea, San Diego, CA (US); Georgiy O. Vaschenko, San Diego, CA (US); Peter Baumgart, San Diego, CA (US); Norbert Bowering, Bielefeld (DE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/168,431

(22) Filed: May 31, 2016

(65) Prior Publication Data
US 2016/0274466 A1    Sep. 22, 2016

Related U.S. Application Data

(62) Division of application No. 13/652,755, filed on Oct. 16, 2012, now Pat. No. 9,392,678.

(51) Int. Cl.
*H05G 2/00* (2006.01)
*G03F 7/20* (2006.01)
*C23C 14/18* (2006.01)

(52) U.S. Cl.
CPC ........ *G03F 7/70033* (2013.01); *C23C 14/185* (2013.01); *H05G 2/006* (2013.01); *H05G 2/008* (2013.01); *H05G 2/003* (2013.01)

(58) Field of Classification Search
CPC ... G03F 7/70025; G03F 7/70033; H05G 2/00; H05G 2/001; H05G 2/003; H05G 2/005; H05G 2/006; H05G 2/008; C23C 14/185
See application file for complete search history.

(56) References Cited

U.S. PATENT DOCUMENTS 3,532,476 A    10/1970    Peehs et al.
4,128,466 A    12/1978    Harding et al.
(Continued)

FOREIGN PATENT DOCUMENTS

CN    101495921 A    7/2009
CN    102369587 A    3/2012
(Continued)

OTHER PUBLICATIONS

Notification of First Office Action, counterpart Chinese Patent Application No. 201380053831.9, mailed Jul. 1, 2016, 11 pages total (including English translation of 6 pages).
(Continued)

*Primary Examiner* — David E Smith
(74) *Attorney, Agent, or Firm* — DiBerardino McGovern IP Group LLC

(57) ABSTRACT

A target material supply apparatus for an extreme ultraviolet (EUV) light source includes a tube that includes a first end, a second end, and a sidewall defined between the first and second ends. At least a portion of an outer surface of the tube includes an electrically insulating material, the first end receives a pressurized target material, and the second end defines an orifice through which the pressurized target material passes to produce a stream of target material droplets. The target material supply apparatus also includes an electrically conductive coating on the outer surface of the tube. The coating is configured to electrically connect the outer surface of the tube to ground to thereby reduce surface charge on the outer surface.

17 Claims, 9 Drawing Sheets

(56) References Cited

U.S. PATENT DOCUMENTS

| | | | |
|---|---|---|---|
| 4,926,090 A | 5/1990 | Rein | |
| 6,912,267 B2 | 6/2005 | Orsini et al. | |
| 7,405,416 B2 | 7/2008 | Algots et al. | |
| 7,449,703 B2 | 11/2008 | Bykanov | |
| 7,875,864 B2 | 1/2011 | Sogard | |
| 7,897,947 B2 | 3/2011 | Vaschenko | |
| 8,158,960 B2 | 4/2012 | Vaschenko et al. | |
| 8,648,536 B2 | 2/2014 | Kuwabara | |
| 8,837,679 B2 | 9/2014 | Hemberg et al. | |
| 9,392,678 B2 * | 7/2016 | De Dea | C23C 14/185 |
| 2006/0192155 A1 | 8/2006 | Algots et al. | |
| 2006/0249699 A1 | 11/2006 | Bowering et al. | |
| 2008/0184584 A1 | 8/2008 | Sogard | |
| 2009/0230326 A1 | 9/2009 | Vaschenko et al. | |
| 2009/0231707 A1 | 9/2009 | Ehm et al. | |
| 2009/0272919 A1 | 11/2009 | Abe et al. | |
| 2010/0025223 A1 * | 2/2010 | Yanagida | H05G 2/003 204/157.15 |
| 2010/0213272 A1 * | 8/2010 | Yabu | G03F 7/70033 239/102.1 |
| 2010/0213275 A1 * | 8/2010 | Ishihara | H05G 2/003 239/102.2 |
| 2011/0284774 A1 * | 11/2011 | Ishihara | H05G 2/003 250/504 R |
| 2012/0062865 A1 | 3/2012 | Six | |
| 2012/0085922 A1 | 4/2012 | Yabu et al. | |
| 2012/0104289 A1 * | 5/2012 | Mizoguchi | H05G 2/008 250/504 R |
| 2012/0147350 A1 | 6/2012 | Yakunin et al. | |
| 2012/0175533 A1 | 7/2012 | Moriya et al. | |
| 2012/0217422 A1 | 8/2012 | Yabu et al. | |
| 2012/0280148 A1 | 11/2012 | Loopstra et al. | |
| 2014/0102875 A1 | 4/2014 | De Dea et al. | |

FOREIGN PATENT DOCUMENTS

| | | |
|---|---|---|
| CN | 102484938 A | 5/2012 |
| CN | 102714911 A | 10/2012 |
| WO | WO2011082894 A1 | 7/2011 |
| WO | WO2012136343 A1 | 10/2012 |

OTHER PUBLICATIONS

Search Report for First Office Action, counterpart Chinese Patent Application No. 201380053831.9, dated Jun. 21, 2016, 2 pages.

International Search Report and the Written Opinion of the International Searching Authority for counterpart International Application No. PCT/US13/61764, mailed Apr. 7, 2014, 12 pages.

X. Zhou et al., "Streaming Potential Effects in Flows on Bio Chips," Summer Bioengineering Conference, Jun. 25-29, 2003, Key Biscayne, Florida, USA.

W. Holstein et al., "Aspects of Electrokinetic Charging in Liquid Microjets," Journal of Physical Chemistry, Mar. 27, 1999, pp. 3035-3042, vol. 103, American Chemical Society, USA.

A. Regel et al., "Electrokinetic Effects in Liquid Mercury," Atomnaya Energiya, Jan. 1963, pp. 122-127, vol. 14, No.1.

Non-Final Office Action in U.S. Appl. No. 13/652,755, parent of the present divisional application, mailed May 5, 2015, 23 pages.

Office Action, counterpart Taiwanese Patent Application No. 102135338, mailed Dec. 9, 2016, 10 pages total (including English translation of 3 pages).

* cited by examiner

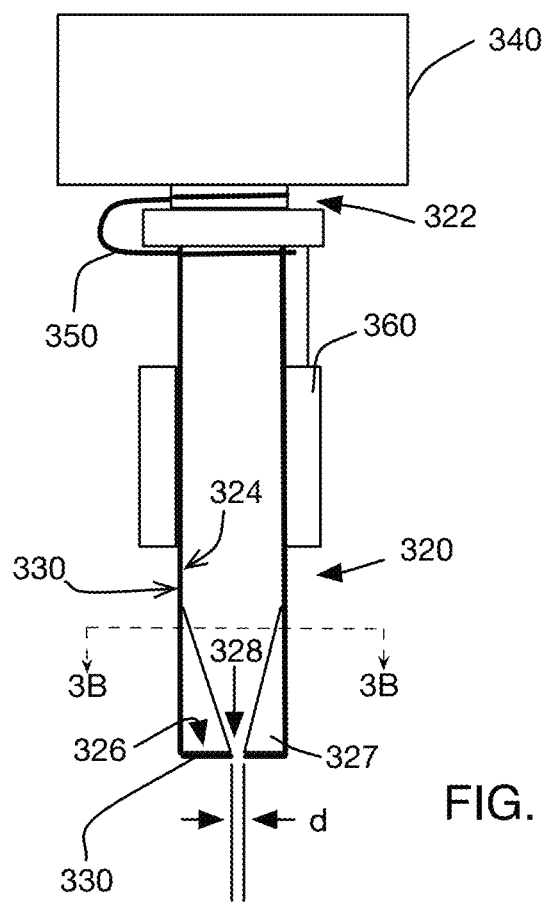
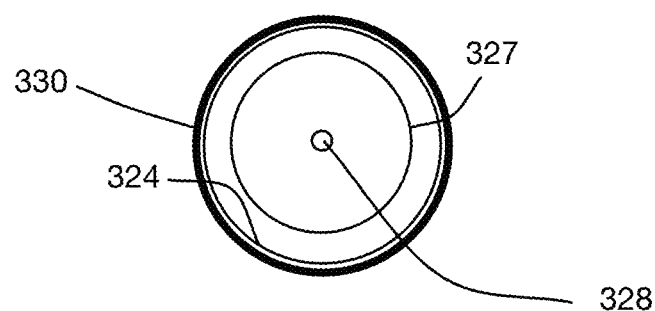
FIG. 3A
FIG. 3B

800

800

TARGET MATERIAL SUPPLY APPARATUS FOR AN EXTREME ULTRAVIOLET LIGHT SOURCE

CROSS-REFERENCE TO RELATED APPLICATION

This application is a divisional of U.S. patent application Ser. No. 13/652,755, filed Oct. 16, 2012, now allowed, and titled TARGET MATERIAL SUPPLY APPARATUS FOR AN EXTREME ULTRAVIOLET LIGHT SOURCE, which is incorporated herein by reference in its entirety.

TECHNICAL FIELD

The disclosed subject matter relates to a target material supply apparatus for an extreme ultraviolet (EUV) light source.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material into a plasma state that has an element, for example, xenon, lithium, or tin, with an emission line in the EUV range. In one such method, often termed laser produced plasma ("LPP"), the required plasma can be produced by irradiating a target material, for example, in the form of a droplet, stream, or cluster of material, with an amplified light beam that can be referred to as a drive laser. For this process, the plasma is typically produced in a sealed vessel, for example, a vacuum chamber, and monitored using various types of metrology equipment.

SUMMARY

In one general aspect, a target material supply apparatus for an extreme ultraviolet (EUV) light source includes a tube that includes a first end, a second end, and a sidewall defined between the first and second ends. At least a portion of an outer surface of the tube includes an electrically insulating material, the first end receives a pressurized target material, and the second end defines an orifice through which the pressurized target material passes to produce a stream of target material droplets. The target material supply apparatus also includes an electrically conductive coating on the outer surface of the tube. The coating is configured to electrically connect the outer surface of the tube to ground to thereby reduce surface charge on the outer surface.

Implementations can include one or more of the following features. The electrically conductive coating can be iridium. The electrically conductive coating can be chromium. The electrically conductive coating can have a thickness of 50 nm or less. The electrically conductive coating can be on a portion of the orifice. The electrically conductive coating can be on an inner surface of the tube. The apparatus can include modulator coupled to the tube, and the modulator can be configured to deflect the tube at a modulating frequency. The electrically conductive coating can be on an outer surface of the modulator. The electrically conductive coating can be on the sidewall and a portion of the second end of the tube.

In some implementations, the apparatus can include a conductive fitting that receives the first end of the tube, and a conductive connection between the conductive fitting and a portion of the electrically conductive coating that is on an outer surface of the sidewall of the tube. The electrically conductive coating can be the conductive connection. The conductive connection can be a distinct metallic element in direct physical contact with the metal fitting and the electrically conductive coating.

The target material can be molten tin. The stream of target material droplets can travel from the orifice towards a target region that receives a laser beam, and a first droplet in the stream of droplets and a second droplet in the stream of droplets can pass through substantially the same spatial location of the target region at different times.

In another general aspect, an assembly that delivers a stream of target material droplets for an extreme ultraviolet (EUV) light source is coated. The assembly includes a tube having an outer surface, at least a portion of which is electrically insulating, a first end, and a second end that defines an orifice that is configured to pass a pressurized target material to produce the stream of target material droplets. The assembly is placed in a chamber that includes a source of a metallic material. The assembly is positioned at an angle relative to the source of metallic material, and at least a portion of an external surface of the sidewall and the second end is coated with the metallic material, where a distance between the source and the assembly is selected to adjust a thickness of the coating.

Implementations can include one or more of the following features. The metal material can be chromium. The metal material can be iridium. The thickness of the coating can be less than 50 nm. The thickness of the coating can be between about 10 nm and 50 nm. A metal vapor can be generated in the chamber, and coating at least a portion of the external surface of the sidewall and the second end with the metal material can include sputtering the metal vapor onto the external surface of the sidewall and the second end. An inside of the orifice can be coated for a distance of half of a width of the orifice. The metal vapor can be sputtered onto the external surface of the sidewall and the second end for an exposure time that is between about 30 seconds and 1 minute. After coating the portion of the external sidewall and the second end of the capillary with the metal material, modulator can be coupled to the capillary tube. The assembly that is placed in the chamber can include a modulator coupled to the capillary tube, and at least a portion of an outer surface of the modulator can be coated with the metallic material. The modulator can include a piezoelectric tube that surrounds part of the sidewall of the capillary tube.

In another general aspect, producing a stream of target material droplets in an extreme ultraviolet (EUV) light source includes electrically connecting a metallic coating on an exterior surface of an insulating tube to ground, applying pressure to a target material held in a reservoir that is in fluid communication with the insulating tube, receiving the pressurized target material through a first end of the tube, and passing the target material through an orifice defined by a second end of the tube to produce the stream of droplets. The droplets travel in a vacuum chamber towards a target region configured to receive a laser beam sufficient to convert a target material droplet into a plasma, and a first droplet in the stream and a second droplet in the stream pass through substantially the same spatial location in the target region at different times.

Implementations may include the following or other features. The pressure can be at least 4000 psi.

Implementations of any of the techniques described above may include a target material supply apparatus, a nozzle assembly, an EUV light source, an EUV system, a kit, a method, a process, a device, or an apparatus. The details of one or more implementations are set forth in the accompanying drawings and the description below. Other features will be apparent from the description and drawings, and from the claims.

DRAWING DESCRIPTION

FIG. 3A is a side view of an example target material supply apparatus that has an electrically conductive coating.

FIG. 3B is a cross-sectional view of a tube of the target material supply apparatus of FIG. 3A taken along section 3B-3B.

DESCRIPTION

Figure 1:
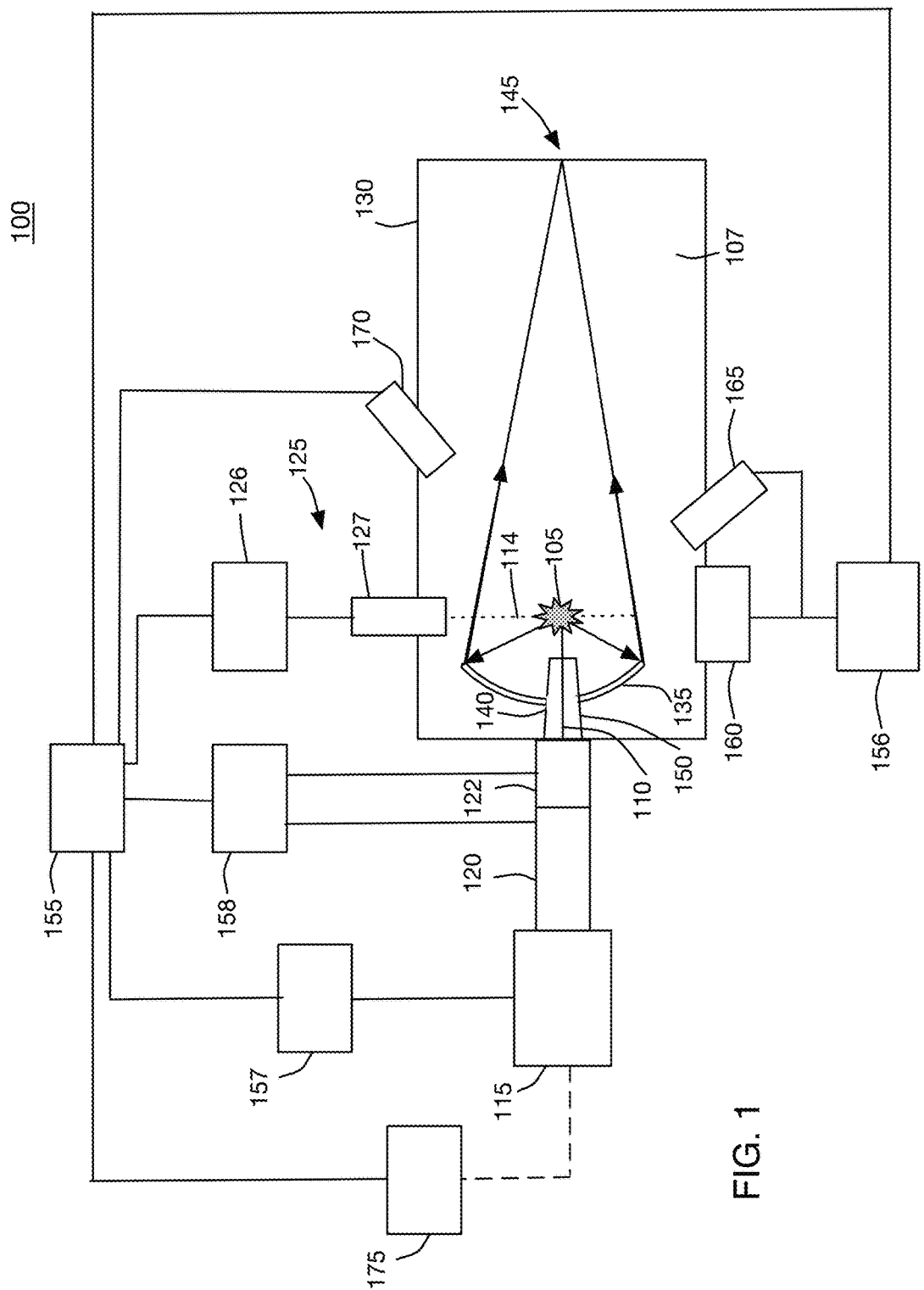
FIG. 1 is a block diagram of a laser produced plasma extreme ultraviolet light source.

A target material supply apparatus or nozzle assembly with an electrically conducting surface or coating is disclosed. The apparatus is used to produce target material droplets in an extreme ultraviolet (EUV) light source. The apparatus includes an electrically insulating tube that passes pressurized target material through an orifice to produce a continuous stream of target material that breaks into a stream of droplets. When irradiated by a laser beam, the droplets are converted to a plasma state and emit EUV light.

Because the target material contained in and passing through the insulating tube is normally electrically conductive, it is expected that the insulating tube would have no or very little surface charge and that the target material exiting the tube would carry little to no electrical charge. However, empirical evidence suggests that surface charge can unexpectedly accumulate on the surface of the insulating tube and the exiting target material can have an electrical charge. Electrical charge on the droplets can cause the droplets to deviate from their expected trajectory as the droplets travel from the orifice to a target region that receives the laser beam. Because the conversion of a droplet into a plasma state depends on the laser beam irradiating the droplet, consistent spatial placement of droplets in the target region can improve the performance of an EUV light source by increasing the number of droplets that are successfully irradiated into the plasma state.

Additionally, the performance of the EUV light source can be improved by producing droplets that have exactly the same rate (or frequency), or nearly the same rate, as the pulses of the pump laser. The pulses of the pump laser typically have a much lower repetition rate (or frequency) than the rate of the droplets that initially break off from the continuous stream of target material that emerges from the nozzle. Larger droplets that have a lower rate, closer to that of the pump laser, can be formed by choosing a modulation regime where small initial droplets have relative velocities that force multiple small initial droplets to coalesce and consistently form larger droplets that have the same rate as the laser pulses. However, the presence of surface charge on the insulating tube and electrical charge in the small initial droplets can impede the formation of larger droplets at the rate of the laser pulses due to a Coulomb repulsion between the droplets. The Coulomb repulsion results in additional force that pushes droplets apart and displaces them in a direction that is perpendicular to the droplet stream. Removing or reducing the surface charge on the insulating tube can help to align the initial small droplets on the same linear trajectory and make them more likely to coalesce into larger droplets that have a rate closer to that of the pump laser.

As discussed in greater detail below, including a metallic portion, such as a metallic coating, on the surface of the insulating tube can reduce or eliminate the surface charge by allowing the surface of the insulating tube to be connected to ground. As such, including the metallic portion on the insulating tube can provide improved efficiency of the EUV light source. Further, because the effects of the electrical charge of the initial small droplets can be more pronounced as the operating pressure on the target material increases, the conductive coating can allow the EUV light source to perform at a higher operating pressure, such as, for example, 4000 pounds-per-square-inch (psi) or higher.

A description of the components of an LPP EUV light source will initially be described before providing a more detailed description of the target material supply apparatus.

Referring to FIG. 1, an LPP EUV light source 100 is formed by irradiating a target mixture 114 at a target location 105 with an amplified light beam 110 that travels along a beam path toward the target location 105. The target location 105, which is also referred to as the irradiation site, is within an interior 107 of a vacuum chamber 130. When the amplified light beam 110 strikes the target mixture 114, a target material within the target mixture 114 is converted into a plasma state that has an element with an emission line in the EUV range. The created plasma has certain characteristics that depend on the composition of the target material within the target mixture 114. These characteristics can include the wavelength of the EUV light produced by the plasma and the type and amount of debris released from the plasma.

The light source 100 also includes a target material delivery system 125 that delivers, controls, and directs the target mixture 114 in the form of liquid droplets, a liquid stream, solid particles or clusters, solid particles contained within liquid droplets or solid particles contained within a liquid stream. The target mixture 114 includes the target material such as, for example, water, tin, lithium, xenon, or any material that, when converted to a plasma state, has an emission line in the EUV range. For example, the element tin can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 114 can also include impurities such as non-target particles. Thus, in the situation in which there are no impurities, the target mixture 114 is made up of only the target material. The target mixture 114 is delivered by the target material delivery system 125 into the interior 107 of the chamber 130 and to the target location 105.

The light source 100 includes a drive laser system 115 that produces the amplified light beam 110 due to a population inversion within the gain medium or mediums of the laser system 115. The light source 100 includes a beam delivery system between the laser system 115 and the target location 105, the beam delivery system including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target location 105.

In some implementations, the laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation.

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 1000. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more. The optical amplifiers in the laser system 115 can also include a cooling system such as water that can be used when operating the laser system 115 at higher powers.

The light source 100 includes a collector mirror 135 having an aperture 140 to allow the amplified light beam 110 to pass through and reach the target location 105. The collector mirror 135 can be, for example, an ellipsoidal mirror that has a primary focus at the target location 105 and a secondary focus at an intermediate location 145 (also called an intermediate focus) where the EUV light can be output from the light source 100 and can be input to, for example, an integrated circuit lithography tool (not shown). The light source 100 can also include an open-ended, hollow conical shroud 150 (for example, a gas cone) that tapers toward the target location 105 from the collector mirror 135 to reduce the amount of plasma-generated debris that enters the focus assembly 122 and/or the beam transport system 120 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the laser control system 157 that can be used, for example, to control the laser timing circuit and/or to the beam control system 158 to control an amplified light beam position and shaping of the beam transport system 120 to change the location and/or focal power of the beam focal spot within the chamber 130.

The target material delivery system 125 includes a target material delivery control system 126 that is operable in response to a signal from the master controller 155, for example, to modify the release point of the droplets as released by a delivery mechanism 127 to correct for errors in the droplets arriving at the desired target location 105.

Additionally, the light source 100 can include a light source detector 165 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 can also include a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and the amplified light beam 110. In other implementations, the metrology system 124 is placed within the beam transport system 120. The metrology system 124 can include an optical element that samples or re-directs a subset of the light, such optical element being made out of any material that can withstand the powers of the guide laser beam and the amplified light beam 110. A beam analysis system is formed from the metrology system 124 and the master controller 155 since the master controller 155 analyzes the sampled light from the guide laser 175 and uses this information to adjust components within the focus assembly 122 through the beam control system 158.

Thus, in summary, the light source 100 produces an amplified light beam 110 that is directed along the beam path to irradiate the target mixture 114 at the target location 105 to convert the target material within the target mixture 114 into plasma that emits light in the EUV range. The amplified light beam 110 operates at a particular wavelength (that is also referred to as a source wavelength) that is determined based on the design and properties of the laser system 115.

Additionally, the amplified light beam 110 can be a laser beam when the target material provides enough feedback back into the laser system 115 to produce coherent laser light or if the drive laser system 115 includes suitable optical feedback to form a laser cavity.

As discussed below, the delivery mechanism 127 that emits the target mixture 114 can include a target material supply apparatus having an insulating tube with a surface that is coated with an electrically conductive material. When connected to ground or to a small DC potential, the electrically conductive coating allows surface charge on the surface of the insulating tube to be removed or substantially reduced.

Figure 2A:
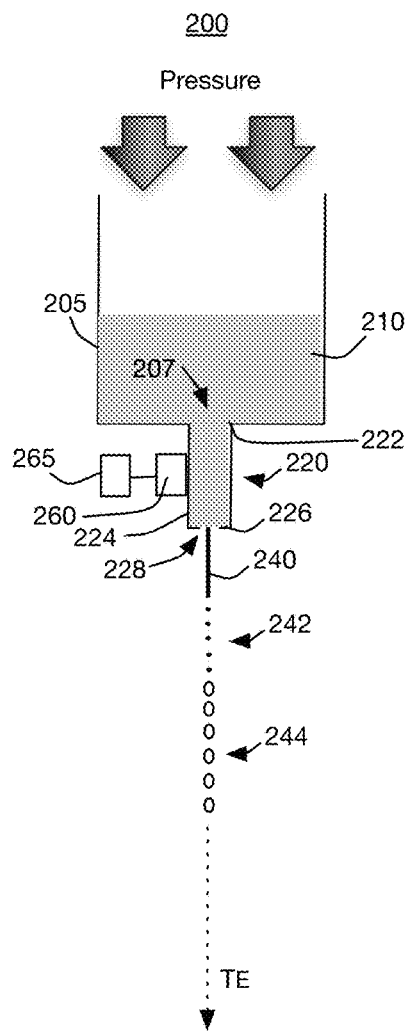
FIG. 2A is a side view of an example target material supply apparatus.

Referring to FIG. 2A, a cross-sectional side view of a target material supply apparatus 200 is shown. The apparatus 200 includes a reservoir 205 that holds a pressurized fluid 210 and a capillary tube 220 that is in fluid communication with the reservoir 205 through an opening 207. The pressure applied to the fluid 210 can be, for example, between 2000 pounds per square inch (psi) and 10,000 psi. The fluid 210 is electrically conductive and can be, for example, a molten metal such as tin. The capillary tube 220 is made from an insulating material, such as glass. The glass can be, for example, fused silica or quartz.

The capillary tube 220 includes a first end 222 that receives the molten metal 210, a sidewall 224, and a second end 226 that defines an orifice 228. The pressure causes the molten metal 210 to flow through the opening 207 and into the first end 222 of the capillary tube 220, where the molten metal 210 is forced through the orifice 228 and exits as a continuous stream 240. As the continuous stream 240 moves away from the orifice 228 and towards the target region 105, the continuous stream 240 separates into initial small droplets 242 that in turn coalesce into larger droplets 244, one or more of which are struck by the amplified light beam 110 and converted into a plasma state to generate EUV light. Ideally, the continuous stream 240, the initial small droplets 242, and the larger final droplets 244 are aligned in a direction "Z" and travel along an expected trajectory "$T_E$" from the orifice 228 to the target region 105.

The apparatus 200 also can include an electro-actuatable element 260. The electro-actuatable element 260 can be, for example, a piezoelectric element. The electro-actuatable element 260 is operably coupled to the target material 210 and to a signal generator 265 that drives the electro-actuatable element 260. In the example of FIG. 2A, the electro-actuatable element 260 is coupled to the tube 220 to deflect the tube 220 and disturb the stream 240. For example, when driven, the electro-actuatable element 260 can selectively squeeze or otherwise move the tube 220 at one or more frequencies. The electro-actuatable element is discussed in U.S. Pat. No. 8,158,960, issued on Apr. 17, 2012, which is incorporated herein by reference in its entirety.

Figure 2B:
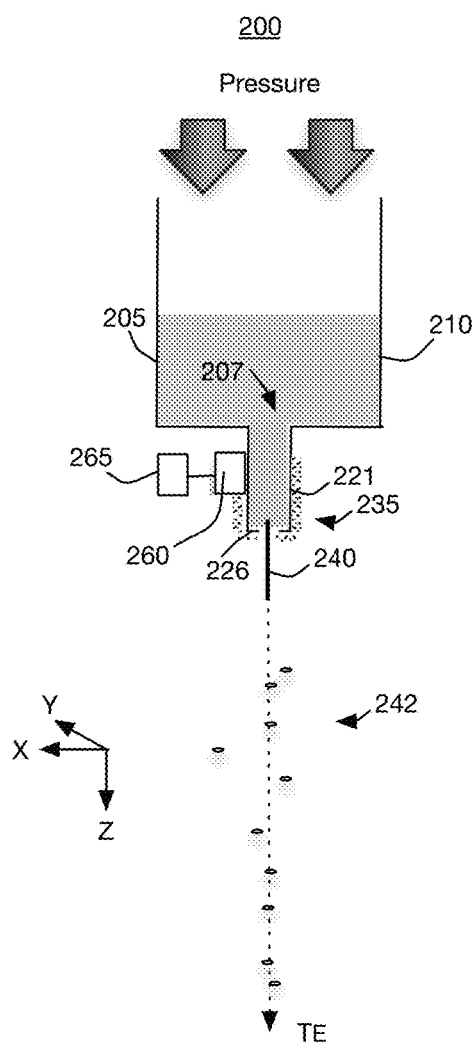
FIG. 2B is a side view of the target material supply apparatus of FIG. 2A with surface charge on a portion of the apparatus.

Referring to FIG. 2B, despite passing a conductive fluid through the capillary tube 220, surface charge 235 can unexpectedly accumulate on an exterior surface 221 of the capillary tube 220. For example, charged particles 235 can accumulate on the outer surfaces of the sidewall 224, the second end 226, and or electrically insulating portions of the electro-actuatable element 260.

The presence of the surface charge 235 can cause the spatial position of the initial small droplets 242 to deviate from the expected trajectory "$T_E$" in directions "X" and "Y." For example, the surface charge 235 can accumulate and spontaneously discharge, creating an electric field that causes the droplets 242 to deviate from their expected path. As a result, the initial metal droplets 242 are not aligned in the "Z" direction, and, thus, the droplet stream can miss the optimum alignment with respect to the irradiating laser beam. Further, the electric field induced by the surface charge 235 can electrically polarize the continuous stream 240 and therefore charge the initial metal droplets 242. The electrically charged droplets repel each other, which can further impede coalescing of the initial small droplets 242.

Referring to FIG. 3A, an example target material supply apparatus 300 includes a capillary tube 320 that has a metallic coating 330. The apparatus 300 can be all or part of the delivery mechanism 127 discussed with respect to FIG. 1. The capillary tube 320 is made of a material (such as quartz) that is electrically insulating. The metallic coating 330 allows the surface of the capillary tube 320 to be electrically connected to ground or a small DC electric potential to remove or reduce surface charge on an outer surface of the capillary tube 320. By removing or reducing the surface charge, electrically conducting droplets produced by the apparatus 300 have a more consistent spatial placement in the target region 105 and are more prone to coalesce into larger droplets that have a frequency that is the same, or nearly the same, as the frequency of the pulses in the amplified light beam 110.

In the apparatus 300, the capillary tube 320 includes a sidewall 324, a second end 326, and a first end 322. The sidewall 324 is between the first end 322 and the second end 326. The second end 326 includes a nozzle 327 that defines an orifice 328 through which a pressurized target material passes to form a continuous jet that breaks into individual droplets (not shown). The orifice 328 can have a diameter "d" of, for example, about 1 μm to about 30 μm. The first end 322 is received in a metal fitting 340 that is connected to ground. The metal fitting 340 is coupled, directly or indirectly, to a reservoir (not shown) that holds the pressurized target material.

The metallic coating 330 that is on the outer surface of the capillary tube 320 extends along an outer surface of the sidewall 324, on an outer surface of the second end 326. The metallic coating 330 also can extend inside the orifice opening. The metallic coating 330 is electrically connected to the metal fitting 340 through an electrically conductive element 350, such as a conductive wire. In some implementations, the metallic coating 330 also can be connected, by direct physical contact, to the metal fitting 340 to provide two electrical connections between the capillary tube 320 and ground.

The apparatus 300 also includes an electro-actuatable element 360 that, when driven, produces a disturbance in the target material that flows through the capillary tube 320. The electro-actuatable element 360 can be, for example, a piezoelectric. In the example shown in FIG. 3A, the electro-actuatable element 360 is placed over the capillary tube 320 after the metallic coating 330 is placed on the capillary tube 320.

FIG. 3B shows a cross-section of the tube 320 taken along section 3B-3B. In the example of FIG. 3B, the tube 320 does not include a target material. As shown in FIG. 3B, the metallic coating 330 is on the sidewall 324, and the nozzle 327 defines the orifice 328.

Figure 4:
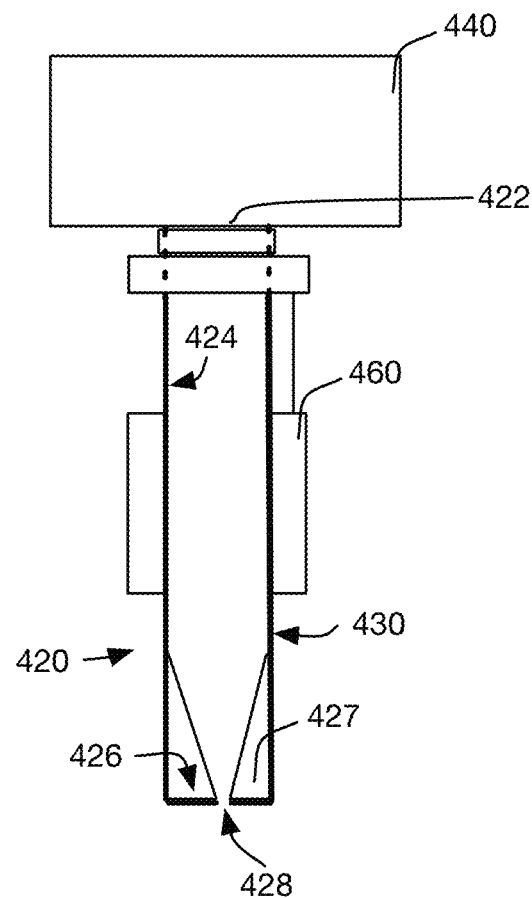
FIG. 4 is a side view of another example target material supply apparatus that has an electrically conductive coating.

Referring to FIG. 4, another example target material supply apparatus 400 includes a capillary tube 420 that has a metallic coating 430 on an exterior surface. The capillary tube 420 is made of a material (such as quartz) that is electrically insulating. The metallic coating 430 allows the capillary tube 420 to be electrically connected to ground or a small DC electric potential to remove or reduce surface charge on an outer surface of the capillary tube 420. The capillary tube 420 includes a sidewall 424, a second end 426, and a first end 422. The second end 426 includes a nozzle 427 that defines an orifice 428, and the first end 422 is received in a metal fitting 440 that is connected to ground. The metal fitting 440 is coupled, directly or indirectly, to a reservoir (not shown) that holds the pressurized target material.

The apparatus 400 is similar to the apparatus 300 (FIGS. 3A and 3B) except, in the apparatus 400, there is no distinct electrically conductive element that electrically connects the metallic coating 430 to the metal fitting 440. Instead, the metallic coating 430 covers at least a portion of an outer surface of the second end 426 and extends along the entire length of the sidewall 424 to directly connect to the metal fitting 440 through physical contact of the metal fitting 440 and the metallic coating 430. Thus, the second end 426 of the apparatus 400 is connected to ground through the metallic coating 430 without an additional element (such as the metal wire 350 shown in FIG. 3A).

The apparatus 400 also can include an electro-actuatable element 460 that produces a disturbance in the molten metal that flows through the capillary tube 420. The electro-actuatable element 460 can be, for example, a piezoelectric. In the example shown in FIG. 4, the metallic coating 430 is on the capillary tube 420, and the electro-actuatable element 460 is placed over the capillary tube 420 after the metallic coating 430 is placed on the capillary tube 420.

Figure 5:
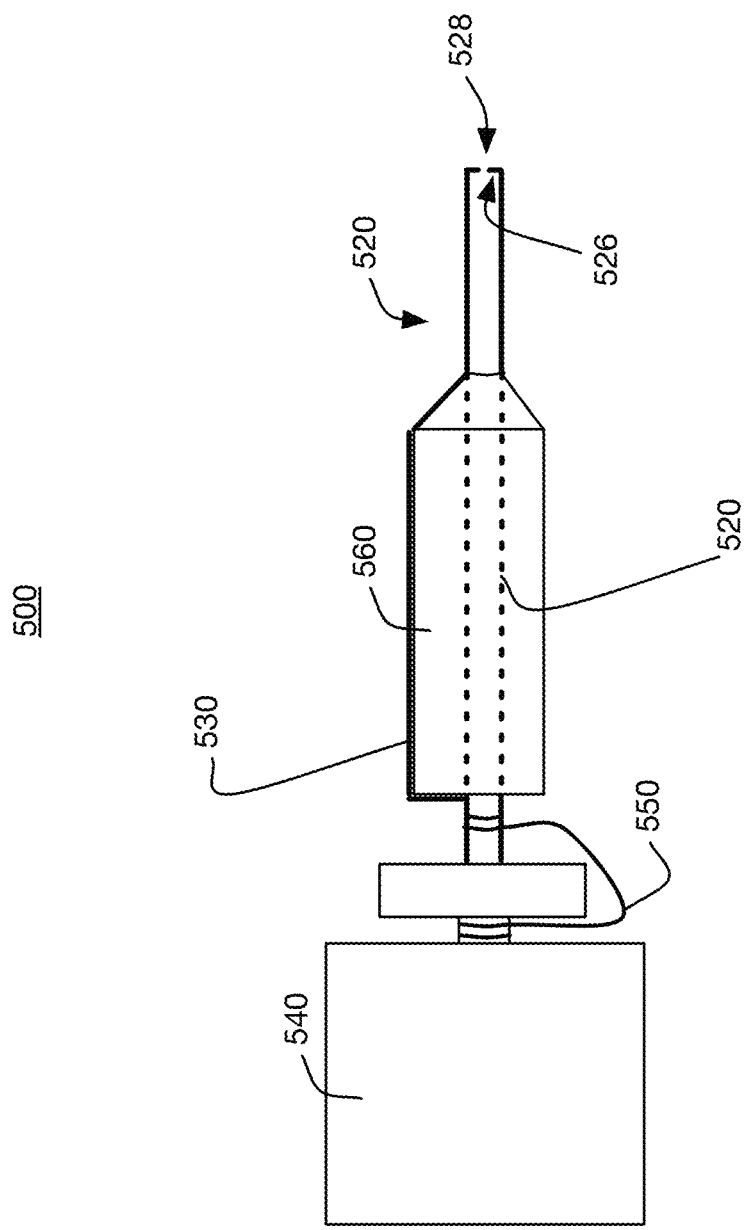
FIG. 5 is a side view of another example target material supply apparatus that has an electrically conductive coating.

Referring to FIG. 5, a side perspective view of another example target material supply apparatus 500 is shown. The apparatus 500 includes a capillary tube 520, an electro-actuatable element 560, and a metal fitting 540. The capillary tube 520 and the electro-actuatable element 560 are at least partially made of an insulating material, such as quartz. The capillary tube 520 includes an end 526 that defines an orifice 528. Pressurized target material flows from a reservoir (not shown) to the capillary tube 520 and exits the tube 520 through the orifice 528. The target material that exits the orifice 528 forms droplets, as discussed above.

The apparatus 500 differs from the apparatus 300 (FIGS. 3A and 3B) and the apparatus 400 (FIG. 4) in that a metallic coating 530 is placed on the electro-actuatable element 560 and the capillary tube 520. The portion of the capillary tube 520 that is covered by the electro-actuatable element 560 can include a metallic coating as well. The metallic coating 530 can, but need not, cover the entire outer surface of the portion of the apparatus 500 that is formed by the capillary tube 520 and the electro-actuatable element 560. The metallic coating 530 can be connected to ground to remove accumulated surface charge from the surface of the tube 520.

To connect the metallic coating 530 to ground, an electrically conductive element 550 is connected to the metal fixture 540 (which is at system ground) and to the metallic coating 530. For example, the conductive element 550 can be a flexible metal wire, one end of which is wrapped around the capillary tube 520 and contacts the metallic coating 530, with the other end of the wire being wrapped around a metal element that is part of, or in electrical contact with, the metallic fixture. Alternatively, or additionally, the wire can be wrapped around a portion of the capillary tube 520 near the orifice 528.

Figure 6:
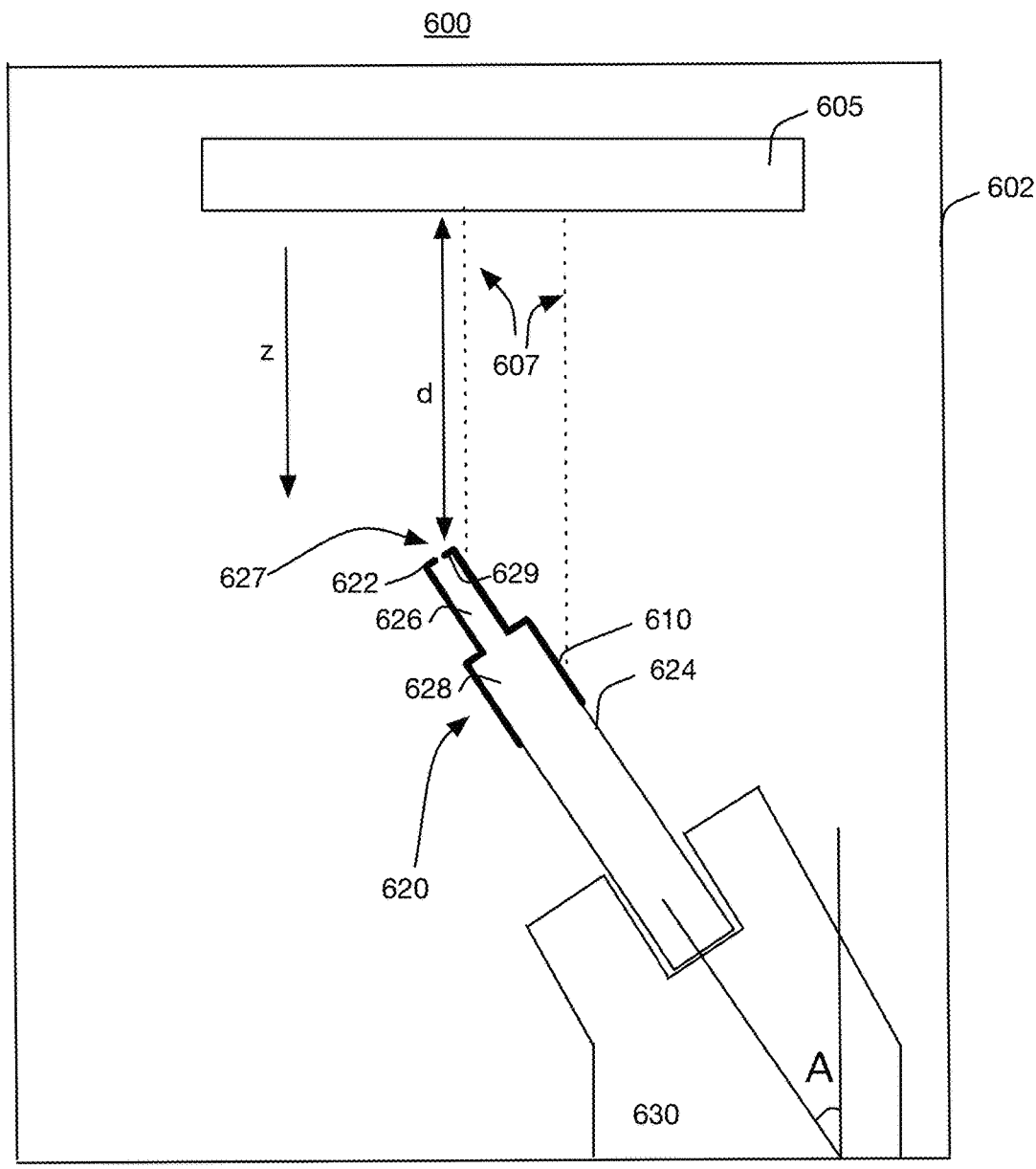
FIG. 6 is an illustration of an example sputter chamber.
Figure 7:
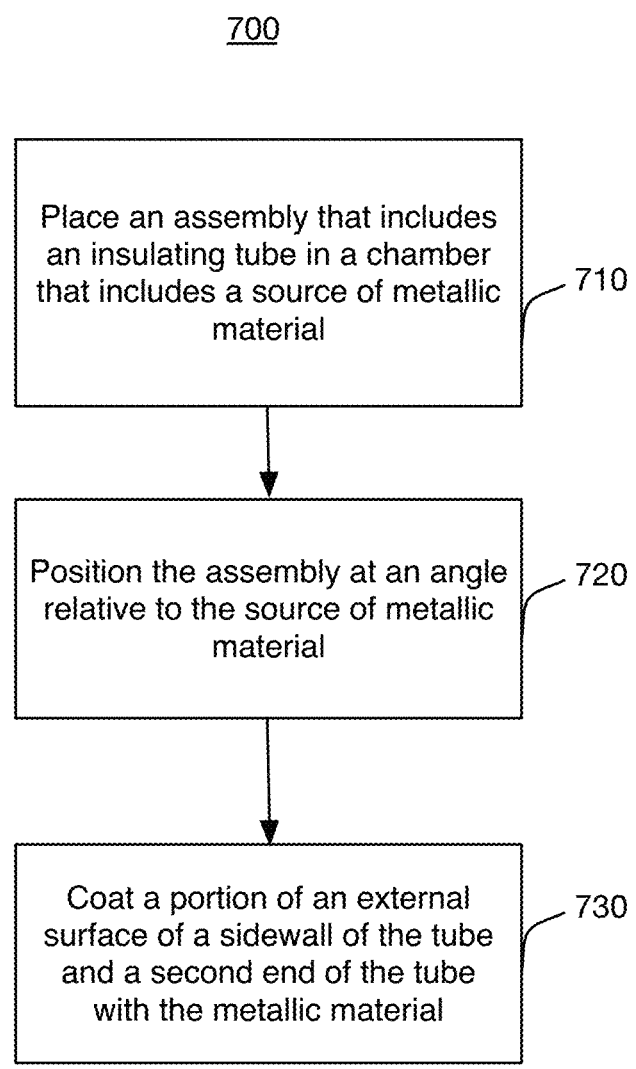
FIG. 7 is an example process for metallizing a target material supply apparatus.

Referring to FIGS. 6 and 7, an example technique for metalizing an electrically insulating portion of a target material supply apparatus is illustrated. FIG. 6 illustrates a sputter coater 600 in which a target material supply apparatus 620 is placed for processing. FIG. 7 illustrates an example process 700 for coating a target material supply apparatus with a metallic coating. The process 700 can be performed using the chamber sputter coater 600. The sputter coater 600 can be, for example, a Turbo Sputter Coater available from Denton Vacuum of Moorestown, N.J.

The sputter coater 600 includes a chamber 602 with a sputtering target 605 that ejects material 607 along a direction "z." The material 607 can be any electrically conductive material. For example, the material 607 can be chromium, iridium, or any other metallic material. The material 607 forms a metal coating (or metal layer) 610 on an exterior surface of a target material supply apparatus 620. The coating 610 also can extend inside the nozzle orifice for a short distance. The apparatus 620 also includes a tube 626, made from an electrically insulating material, and a piezoelectric element 628 that surrounds a portion of the tube 626. The piezoelectric element 628 has an exterior surface, and at least a portion of the surface is insulating. The apparatus 620 includes a front face 622 and a side 624.

The apparatus 620 is held in the chamber 602 by a fixture 630. The fixture 630 holds the apparatus 620 at an angle "A" relative to the direction "z." Holding the apparatus 620 at the angle "A" causes the metal material 607 that forms the coating 610 to fall on a front face 622 and a side 624 of the apparatus 620.

Referring to FIG. 7, the process 700 can be used with the chamber 602 to metallize the apparatus 620. The apparatus 620 is placed in the chamber 602 (710). The apparatus 620 is positioned at the angle "A" (720). Positioning the apparatus 620 at the angle "A" helps to ensure deposition of a continuous conductive path from the surface 622 to the surface 624. Further, by positioning the apparatus 620 at the angle "A" in the chamber 601, the metal material 607 is placed on the front face 622 and the side 624 of the apparatus 620.

The sputtering target 605 releases the metal material 607 to coat at least a portion of an outer surface of the front face 622 and the side 624 of the apparatus 620 (730). The apparatus 620 can be exposed to the sputtered metal material 607 for approximately thirty seconds to one minute. Once the apparatus 620 has been exposed to the metal material 607, the metal coating 610 is present on an outer surface of the insulating tube 626 and the piezoelectric element 628. The metal coating 610 forms a continuous conductive path with one end of the path on the front face 622 and the other on the side 624. The metal coating 610 also can coat a portion of a side 629 that is on the interior of the apparatus 620.

Although the metal coating 610 is shown in FIG. 6 as being on more than one side of the apparatus 620, this is not necessarily the case. For example, the metal coating 610 can be formed as a continuous conductive strip having one end on the front face 622 and a second end on the side 624 but without covering the entire outer surface of the front face 622 or the side 624.

The exposure time and distance of the apparatus 620 from the sputtering target 605 determines the thickness of the metal coating 610, and the thickness is selected such that the metal coating 610 does not obstruct the orifice 627. The orifice 627 can have a diameter of approximately 1 to 30 μm. In use, the apparatus 620 produces a stream of metal droplets by passing a pressurized molten metal through the orifice 627. Thus, the metal coating 610 is formed to be thin enough such that the orifice 627 is not obstructed, but thick enough to form a continuous electrically conductive path between any two points on the metal coating 610. For example, the metal coating 610 can have a thickness of approximately 10 to 50 nm. Because the metal coating 610 is thin enough to leave the orifice 627 unobstructed, coating methods that can be used on tubes with orifices that are much larger in diameter than the orifice 627 (for example, an order of magnitude or more larger than the diameter of the orifice 627) are not applicable or modifiable to achieve the process 700.

The thickness of the metal coating 610 is not necessarily uniform, but the metal coating 610 has a thickness throughout that is sufficient to maintain electrical conductivity without obstructing the orifice 627. The nominal thickness of the metal coating 610 is determined by a distance "d" from the sputtering target 605 to the front face 622 of the apparatus 620 and by the exposure time. For example, to make a metal coating that is 10 to 50 nm thick, the distance "d" between the sputtering target 605 and the front face 622 can be approximately two inches (5.08 cm) and the exposure time can be between about thirty seconds and one minute.

In the examples of FIGS. 6 and 7, the piezoelectric element is coupled to the tube of the apparatus before the metal coating 610 is applied, resulting in the outer surface of the piezoelectric element also having the metal coating 610. However, in some implementations, such as the example shown in FIGS. 8A and 8B, the piezoelectric element can be coupled to the tube of the apparatus after the tube is coated with metal.

Figure 8A:
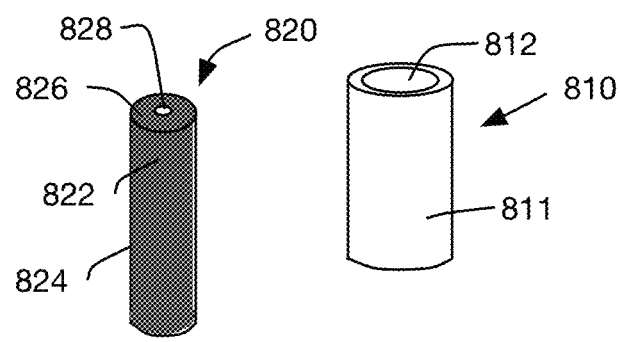
FIGS. 8A and 8B are a perspective view of another example target material supply apparatus.
Figure 8B:
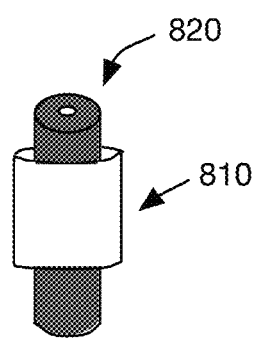

Referring to FIGS. 8A and 8B, an example apparatus 800 includes a piezoelectric element 810 that is coupled to a tube 820. The piezoelectric element 810 is coupled to the tube 820 after a metal coating 822 is applied to an end 826 and sidewall 824 of the tube 820. The end 826 defines an orifice 828. The metal coating 822 does not block the orifice 828.

In the example shown in FIGS. 8A and 8B, the piezoelectric element 810 is cylindrical and has a sidewall 811 that defines a round or circular opening 812 that is wide enough in diameter to surround the outer surface of the tube 820. The opening 812 of the piezoelectric element 810 is slid over the tube 820 to couple the piezoelectric element 810 to the tube 820. The piezoelectric element 810 and the tube 820 can be further coupled together with an adhesive.

The piezoelectric element 810 includes lead wires (not shown) that connect to a driver that drives the piezoelectric element 810. Coupling the piezoelectric element 810 to the tube 820 after the metal coating 822 is applied to the tube 820 can help reduce the occurrence of the lead wires being grounded or shorted together through unintentional contact with the metal coating 822. The insulating portions of the surface of the tube 820 can be separately metallized to avoid or reduce accumulation of surface charge on the outer surface of the piezoelectric element 810.

Figure 9:
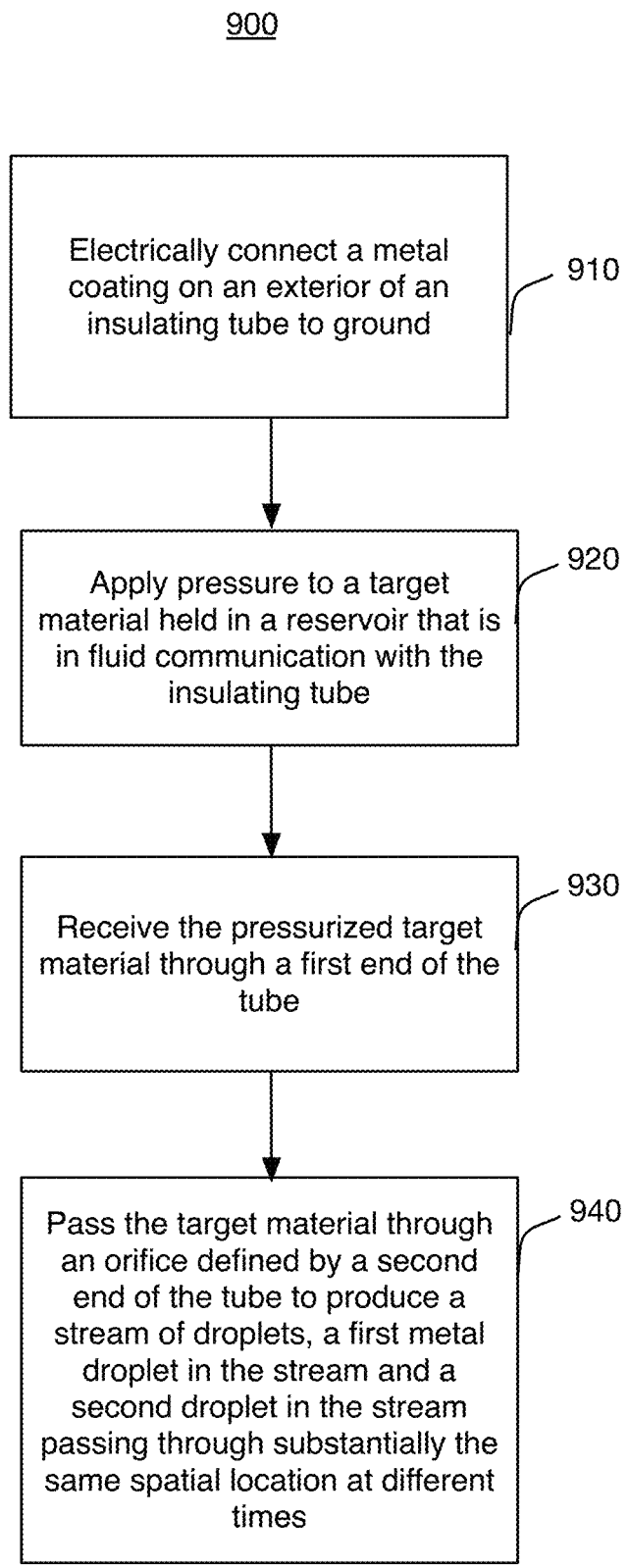
FIG. 9 is an example process for using a metallized target material supply apparatus in an EUV light source.

Referring to FIG. 9, an example process 900 for producing a stream of target material droplets in an EUV light source is shown. The example process 900 can be performed with the EUV light source 100 (FIG. 1). The example process 900 is discussed with reference to the apparatus 300 (FIGS. 3A and 3B) being all or part of the delivery mechanism 127 that produces the target mixture 114. However, the process 900 can be performed with any of the apparatuses 300, 400, 500, 620, and 800 being all or part of the delivery mechanism 127.

The metallic coating 330 that is on the outer surface of the insulating capillary tube 320 is connected to ground (910). Connecting the metallic coating 330 to ground removes or reduces surface charges that are on the surface of the capillary tube 320. The metallic coating 330 can be connected to ground by connecting the electrically conductive element 350 (such as a flexible metal wire) to the metallic coating 330 and to a portion of the EUV light source 100 that is grounded. For example, the metal fitting 340 is grounded. Thus, the electrically conductive element 350 can be electrically connected to ground by wrapping the element 350 around the outside of the sidewall 324 and around a conductive element on the metal fitting 340.

In other implementations, the metallic coating 330 is connected to ground by directly connecting the metallic coating 330 to the metal fitting 340 by physical contact. For example, the metallic coating 330 can be formed on the second end 326 and along the entire length of the sidewall 324 and then connected directly to the metal fitting 340 to make such a direct connection. In other implementations, the metallic coating 330 is connected to ground through both the direct connection and with a separate electrically conductive element (such as a flexible metal wire). In some instances, instead of being connected to ground, the metallic coating 330 can be connected to a small electric DC potential. For example, the metallic coating 330 can be connected to a DC potential that is negative to remove positive charges that form on the surface of the tube 320 more quickly.

Pressure is applied to the fluid held in a reservoir that is in fluid communication with an end of the capillary tube 320 (920). The fluid is a target material that is transformed into a stream of liquid droplets (or targets) by passing through the orifice 328 in the capillary tube 320. The droplets in the stream of target material droplets produce EUV light when irradiated by the amplified beam of light 110. The target material can be, for example, tin, lithium, xenon, or combinations of these metals. The element tin may be used as pure tin, as a tin compound such as $SnBr_4$, $SnBr_2$, $SnH_4$, or as a tin alloy, such as a tin-gallium, tin-indium, tin-indium-gallium alloy. The pressure applied to the target material (or the operating pressure) can be at least 2,000 psi, and can be as high as 10,000 psi. For example, the applied pressure can be 2000 psi, 2500 psi, or 4000 psi. The pressure causes the target material to flow from the reservoir and to be received through the first end 318 of the capillary tube 320 (930). The target material passes through the capillary tube 320 and exits through the orifice 328 to produce the stream of droplets (940). The target material exits the orifice 328 as a continuous jet, and then breaks apart into a stream of individual droplets.

Referring also to FIG. 1, the target droplets travel in the vacuum chamber 130 to the target region 105 that receives the amplified light beam 110. When the laser beam irradiates a droplet, the droplet is converted into a plasma that emits EUV light. The droplets pass through the target region 105 one-by-one, and, thus, each droplet passes through the target region 105 at a different time. Because the surface of the tube 320 is grounded, the spatial position of the droplets in the stream does not vary, or varies only slightly, from an expected trajectory between the tube 320 and the target region 105. Thus, the spatial location of a first droplet as it passes through the target region 105 is substantially the same as the spatial location of a second droplet when it passes through the target region 105 at a later time. For example, the standard deviation of the spatial location of each of the droplets in the stream as they pass through a target region that is 25 cm from the apparatus can be less than 10 µm. The standard deviation can be about 5 µm or less. In another example, the standard deviation of the spatial location of the droplets in the stream as they pass through the target region is such that the amplified light beam 110 irradiates a majority of the individual droplets and converted into a plasma.

Other implementations are within the scope of the following claims. For example, multiple nozzle assemblies can be coated simultaneously in the chamber 602 of the sputter coater 600. Any of the insulating tubes of the target material supply apparatuses 300, 400, 500, 620, and 800 can be made from metal or another electrically conductive material. Any of the insulating tubes of the target material supply apparatuses 300, 400, 500, 620, and 800 can be used as all or part of the delivery mechanism 127 of FIG. 1. Any of the metal coatings discussed above can be made of any electrically conductive material or from a combination of electrically conductive materials. Each of the tubes 320, 420, 520, 626, and 820 defines a passage. The passage can have a cross-section of any shape. The target material may be a molten metal. For example, the target material may be molten tin.

What is claimed is:

1. A method for producing a stream of target material droplets in an extreme ultraviolet (EUV) light source, the method comprising:
    electrically connecting a metallic coating on an exterior surface of an insulating tube to ground;
    applying pressure to a target material held in a reservoir that is in fluid communication with the insulating tube;
    receiving the pressurized target material through a first end of the tube; and
    passing the target material through an orifice defined by a second end of the tube to produce the stream of droplets, wherein
    the droplets travel in a vacuum chamber towards a target region configured to receive a laser beam sufficient to convert a target material droplet into a plasma, and a first droplet in the stream and a second droplet in the stream pass through substantially the same spatial location in the target region at different times.

2. The method of claim 1, wherein the pressure is at least 4000 psi.

3. The method of claim 1, wherein the pressure is at least 2000 psi.

4. The method of claim 1, wherein the pressure is between 2000 psi and 10000 psi.

5. The method of claim 1, wherein electrically connecting the metallic coating to ground comprises connecting an electrically conductive element to the metallic coating, and connecting the electrically conductive element to a grounded portion of the EUV light source.

6. The method of claim 1, wherein the metallic coating on the exterior surface of the insulating tube is on the second end of the tube that defines the orifice.

7. The method of claim 1, wherein
    the insulating tube is received in a conductive fitting at the first end, the conductive fitting being grounded,
    the metallic coating on the exterior surface of the insulating tube is on the second end of the tube and extends to a portion of the exterior surface of the insulating tube that is received in the conductive fitting such that the metallic coating is connected to ground through a direct connection between the metallic coating and the conductive fitting.

8. A method for producing a stream of target material droplets in an extreme ultraviolet (EUV) light source, the method comprising:
    electrically connecting a metallic coating on an exterior surface of an insulating structure to an electrical potential, the insulating structure comprising a first end, a second end, and a sidewall between the first end and the second end, the sidewall defining an interior space;
    applying pressure to a target material held in a reservoir that is in fluid communication with the interior space of the insulating structure;
    receiving the pressurized target material through the first end of the insulating structure; and
    passing the target material through an orifice defined by the second end of the insulating structure to produce the stream of target material droplets, wherein
    the target material droplets travel in a vacuum chamber toward a target region configured to receive a laser beam sufficient to convert a target material droplet into a plasma, and
    a plurality of the target material droplets in the stream pass through substantially the same spatial location in the target region, each droplet in the plurality of target material droplets passing through the target region at a different time.

9. The method of claim 8, wherein each target material droplet in the plurality of target material droplets passes through a spatial location in the target region, the standard deviation of the spatial locations being 10 microns ($\mu$m) or less.

10. The method of claim 8, wherein each target material droplet in the plurality of target material droplets passes through a spatial location in the target region, the standard deviation the spatial locations being 5 microns ($\mu$m) or less.

11. The method of claim 8, wherein the metallic coating on the exterior surface of the insulating structure is on the second end of the insulating structure that defines the orifice.

12. The method of claim 8, wherein the pressure is at least 4000 psi.

13. The method of claim 8, wherein the pressure is at least 2000 psi.

14. The method of claim 8, wherein the pressure is between 2000 psi and 10000 psi.

15. The method of claim 8, wherein electrically connecting a metallic coating on an exterior surface of an insulating structure to an electrical potential comprises electrically connecting the metallic coating to ground.

16. The method of claim 8, wherein electrically connecting a metallic coating on an exterior surface of an insulating structure to an electrical potential comprises electrically connecting the metallic coating to a conductive fitting held at a direct-current (DC) electric potential, the DC electric potential being a different potential than a potential of the metallic coating such that a potential difference is formed between the metallic coating and the conductive fitting.

17. The method of claim 8, wherein the plurality of target material droplets includes fewer than all of the target material droplets in the stream.

* * * * *